(12) United States Patent
Sugita et al.

(10) Patent No.: US 11,164,729 B2
(45) Date of Patent: Nov. 2, 2021

(54) MEASURING DEVICE AND OPERATION METHOD OF SYSTEM FOR INSPECTING FOCUS RING

(71) Applicant: TOKYO ELECTRON LIMITED, Tokyo (JP)

(72) Inventors: Kippei Sugita, Miyagi (JP); Daisuke Kawano, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 128 days.

(21) Appl. No.: 16/296,704

(22) Filed: Mar. 8, 2019

(65) Prior Publication Data

US 2019/0279848 A1 Sep. 12, 2019

(30) Foreign Application Priority Data

Mar. 9, 2018 (JP) .............................. JP2018-042968

(51) Int. Cl.
*G01R 31/00* (2006.01)
*H01J 37/32* (2006.01)
(Continued)

(52) U.S. Cl.
CPC ...... *H01J 37/32642* (2013.01); *G01D 5/2417* (2013.01); *G01R 27/2605* (2013.01);
(Continued)

(58) Field of Classification Search
USPC ................. 324/754.24, 703, 750.03, 750.04; 438/110; 156/345.34, 345.51
See application file for complete search history.

(56) References Cited

U.S. PATENT DOCUMENTS

2006/0102288 A1* 5/2006 Satoh ................ H01L 21/67069
156/345.51
2007/0224709 A1* 9/2007 Ogasawara ....... H01J 37/32642
438/5
(Continued)

FOREIGN PATENT DOCUMENTS

CN 106920729 A 7/2017
JP 2017-003557 A 1/2017
KR 10-2011-0080811 A 7/2001

*Primary Examiner* — Vincent Q Nguyen
(74) *Attorney, Agent, or Firm* — Rothwell, Figg, Ernst & Manbeck, P.C.

(57) ABSTRACT

A measuring device and method, provided in a region surrounded by a focus ring and configured to measure an amount of consumption of the focus ring, includes a disc-shaped base substrate, sensor electrodes provided on the base substrate, a high frequency oscillator configured to apply a high frequency signal to the sensor electrodes, and an operation unit configured to calculate measurement values indicating electrostatic capacitances of the sensor electrodes from detection values corresponding to potentials of the sensor electrodes. The operation unit calculates a representative value (for example an average value) of the measurement values corresponding to the amount of consumption of the focus ring and derives the amount of consumption of the focus ring with reference to a table in which the amount of consumption of the focus ring is associated with the representative value of the measurement values.

10 Claims, 11 Drawing Sheets

(51) Int. Cl.
*G01D 5/241* (2006.01)
*G01R 27/26* (2006.01)
G01B 7/06 (2006.01)
H01J 9/42 (2006.01)

(52) U.S. Cl.
CPC .......... *H01J 37/32935* (2013.01); *G01B 7/06* (2013.01); *G01B 7/08* (2013.01); *H01J 9/42* (2013.01); *H01J 37/32009* (2013.01)

(56) References Cited

U.S. PATENT DOCUMENTS

| | | |
|---|---|---|
| 2016/0363433 A1 | 12/2016 | Sugita et al. |
| 2016/0363556 A1 | 12/2016 | Sugita et al. |
| 2017/0278735 A1 | 9/2017 | Sugita et al. |
| 2018/0301322 A1* | 10/2018 | Sugita ............... H01L 21/67748 |
| 2018/0366305 A1* | 12/2018 | Nagami ............ H01J 37/32642 |

* cited by examiner

MEASURING DEVICE AND OPERATION METHOD OF SYSTEM FOR INSPECTING FOCUS RING

CROSS-REFERENCE TO RELATED APPLICATIONS

This application claims priority to Japanese Patent Application No. 2018-042968 filed on Mar. 9, 2018, the entire contents of which are incorporated herein by reference.

TECHNICAL FIELD

The present disclosure relates to a measuring device and an operation method of a system for inspecting a focus ring.

BACKGROUND

In manufacturing electronic devices such as semiconductor devices, a plasma processing apparatus is used. The plasma processing apparatus includes a processing chamber and a mounting table for mounting thereon a target object. The mounting table is provided in the processing chamber. In the plasma processing apparatus, the target object is mounted on the mounting table and processed by plasma of a processing gas which is generated in the processing chamber.

In the above-described plasma processing apparatus, in order to improve in-plane uniformity of the processing of the target object, a focus ring may be provided on the mounting table to surround the edge of the target object. The plasma processing apparatus using the focus ring is disclosed in Japanese Patent Application Publication No. 2017-3557.

In the plasma processing apparatus, the focus ring as well as the target object is exposed to active species of atoms or molecules in the processing gas. Therefore, the focus ring is consumed by the processing of the target object. The excessively consumed focus ring may affect the processing of the target object, so that it is required to replace the excessively consumed focus ring.

From the above, the focus ring needs to be inspected to check the amount of consumption of the focus ring.

SUMMARY

In accordance with an aspect, there is provided a measuring device which is provided in a region surrounded by a focus ring and configured to measure an amount of consumption of the focus ring. The measuring device comprises a disc-shaped base substrate, a plurality of sensor electrodes, a high frequency oscillator, and an operation unit. The plurality of sensor electrodes is provided on the base substrate. The high frequency oscillator is configured to apply a high frequency signal to the plurality of sensor electrodes. The operation unit is configured to calculate a plurality of measurement values indicating electrostatic capacitances of the plurality of sensor electrodes from a plurality of detection values corresponding to potentials of the plurality of sensor electrodes. The operation unit calculates a representative value (e.g., average value) of the measurement values corresponding to the amount of consumption of the focus ring and derives the amount of consumption of the focus ring with reference to a table in which the amount of consumption of the focus ring is associated with the representative value (average value) of the measurement values corresponding to the amount of consumption.

In accordance with another aspect, there is provided an operation method of a system, which includes a processing system and a measuring device, for inspecting a focus ring. The processing system includes: a processing apparatus having a chamber body, a mounting table provided in a chamber provided by the chamber body, and the focus ring provided on the mounting table; and a transfer unit configured to transfer a target object onto the mounting table and into a region surrounded by the focus ring based on transfer position data. The measuring device includes: a disc-shaped base substrate; a plurality of sensor electrodes provided on the base substrate; a high frequency oscillator configured to apply a high frequency signal to the sensor electrodes; and an operation unit configured to calculate a plurality of measurement values indicating electrostatic capacitances of the sensor electrodes from a plurality of measurement values corresponding to potentials of the sensor electrodes. The operation method comprises: transferring the measuring device by the transfer unit to a central position in the region specified by the transfer position data; calculating a representative value (e.g., average value) of the measurement values calculated by the measuring device transferred to the central position in the region; and deriving the amount of consumption of the focus ring with reference to a table in which the amount of consumption of the focus ring is associated with the representative value (average value) of the measurement values corresponding to the amount of consumption.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
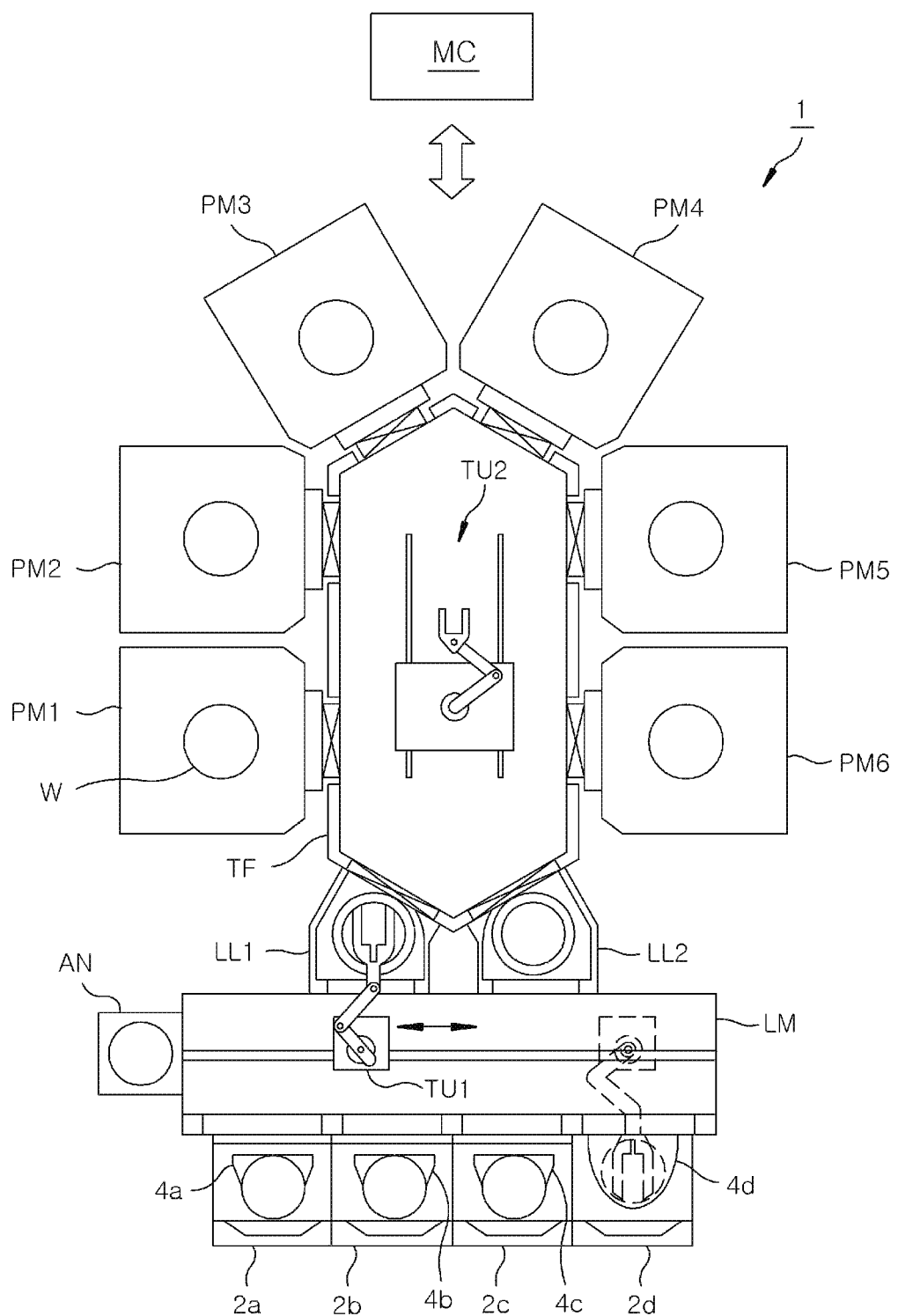
FIG. 1 shows an example of a processing system.

Hereinafter, embodiments will be described in detail with reference to the accompanying drawings. Like reference numerals will be given to like or corresponding parts throughout the drawings.

FIG. 1 shows an example of the processing system. The processing system 1 includes stages 2a to 2d, containers 4a to 4d, a loader module LM, an aligner AN, load-lock modules LL1 and LL2, process modules PM1 to PM6, a transfer module TF, and a control unit MC. The number of the stages 2a to 2d, the number of the containers 4a to 4d, the number of the load-lock modules LL1 and LL2, and the number of the process modules PM1 to PM6 are not limited and may be one or more.

The stages 2a to 2d are arranged along one side of the loader module LM. The containers 4a to 4d are mounted on the stages 2a to 2d, respectively. Each of the containers 4a to 4d is, e.g., a container referred to as FOUP (Front Opening Unified Pod). Each of the containers 4a to 4d is configured to accommodate target objects W. The target object W has a substantially disc shape similar to that of a wafer.

The loader module LM has a chamber wall that defines an atmospheric transfer space therein. A transfer unit TU1 is provided in this transfer space. The transfer unit TU1 is, e.g., a multi-joint robot, and is controlled by the control unit MC. The transfer unit TU1 is configured to transfer the target object W between the containers 4a to 4d and the aligner AN, between the aligner AN and the load-lock modules LL1 to LL2, and between the load-lock modules LL1 to LL2 and the containers 4a to 4d.

Figure 2:
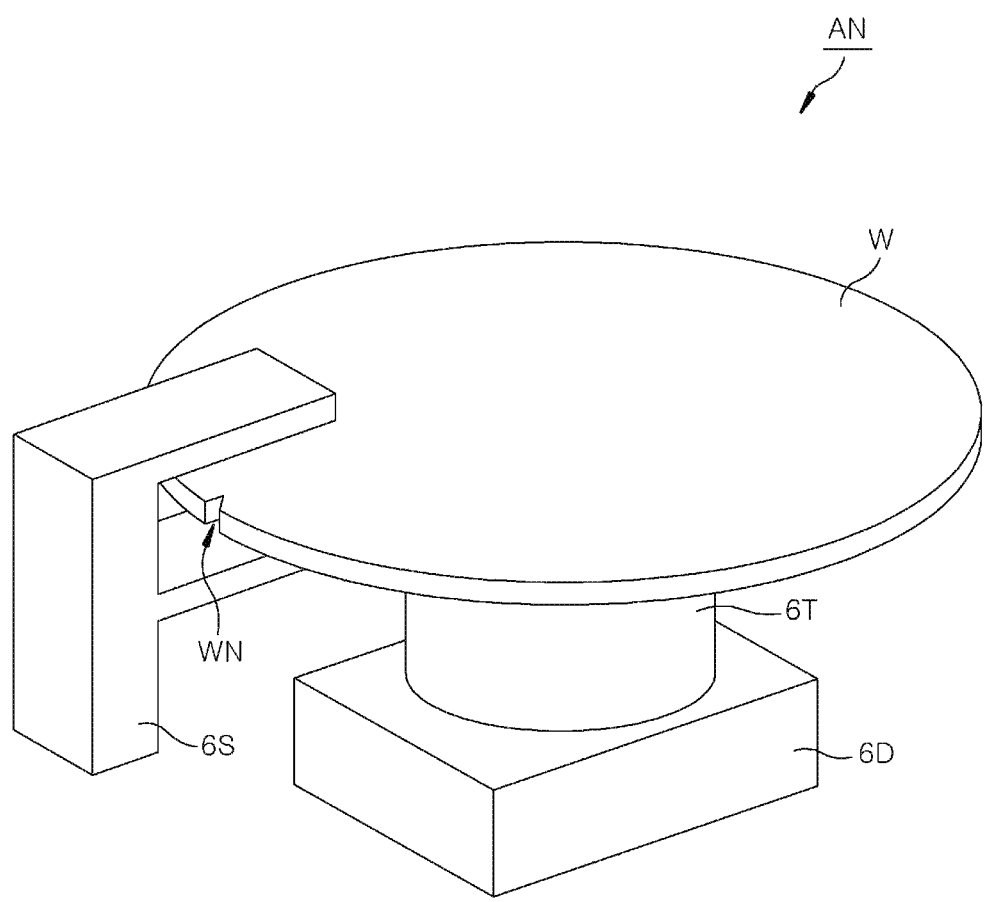
FIG. 2 is a perspective view showing an example of an aligner.

The aligner AN is connected to the loader module LM. The aligner AN is configured to adjust (calibrate) the position of the target object W. FIG. 2 is a perspective view showing an example of the aligner. The aligner AN includes a supporting table 6T, a driving unit 6D, and a sensor 6S. The supporting table 6T is a table that is rotatable about an axis extending in a vertical direction, and is configured to support the target object W thereon. The supporting table 6T is rotated by the driving unit 6D. The driving unit 6D is controlled by the control unit MC. When the supporting table 6T is rotated by power from the driving unite 6D, the target object W mounted on the supporting table 6T is also rotated.

The sensor 6S is an optical sensor, and detects an edge of the target object W during the rotation of the target object W. The sensor 6S detects the amount of deviation of an angular position of a notch WN (or another marker) of the target object W from a reference angular position and the amount of deviation of a central position of the target object W from the reference position based on the edge detection result. The sensor 6S outputs the amount of deviation of the angular position of the notch WN and the amount of deviation of the central position of the target object W to the control unit MC. The control unit MC calculates the amount of rotation of the supporting table 6T which will be used for correcting the angular position of the notch WN to the reference angular position based on the amount of deviation of the angular position of the notch WN. The control unit MC controls the driving unit 6D to rotate the supporting table 6T by the amount of rotation. Accordingly, the angular position of the notch WN can be corrected to the reference angular position. Further, the control unit MC controls a position of an end effector of the transfer unit TU1 at the time of receiving the target object W from the aligner AN based on the amount of deviation of the central position of the target object W such that the central position of the target object W coincides with a predetermined position on the end effector of the transfer unit TU1.

Referring back to FIG. 1, each of the load-lock modules LL1 and LL2 is provided between the loader module LM and the transfer module TF. Each of the load-lock modules LL1 and LL2 provides a preliminary decompression chamber.

The transfer module TF is connected to the load-lock modules LL1 and LL2 through gate valves. The transfer module TF provides a decompressurizable decompression chamber. A transfer unit TU2 is provided in this decompression chamber. The transfer unit TU2 is, e.g., a multi-joint robot, and is controlled by the control unit MC. The transfer unit TU2 is configured to transfer the target object W between the load-lock modules LL1 and LL2 and the process modules PM1 to PM6 and between any two process modules among the process modules PM1 to PM6.

The process modules PM1 to PM6 are connected to the transfer module TF through gate valves. Each of the process modules PM1 to PM6 is a processing apparatus configured to perform a dedicated process, such as plasma processing, on the target object W.

The following is description on a series of operations at the time of processing the target object W in the processing system 1. The target object W is unloaded from any one of the containers 4a to 4d and transferred to the aligner AN by the transfer unit TU1 of the loader module LM. Next, the transfer unit TU1 transfers the aligned target object W from the aligner AN to one of the load-lock modules LL1 and LL2. Then, a pressure in a preliminary decompression chamber of the load-lock module LL1 or LL2 is decreased to a predetermined level. Thereafter, the target object W is transferred from the load-lock module LL1 or LL2 to one of the process modules PM1 to PM6 by the transfer unit TU2 of the transfer module TF. The target object W is processed in one or more process modules among the process modules PM1 to PM6. Next, the processed target object W is transferred from the process module to one of the load-lock modules LL1 and LL2 by the transfer unit TU2. Then, the target object W is transferred from the load-lock module LL1 or LL2 to one of the containers 4a to 4d by the transfer unit TU1.

As described above, the processing system 1 includes the control unit MC. The control unit MC may be a computer including a processor, a storage unit such as a memory, a display unit, an input/output unit, a communication unit, and the like. The above-described series of operations of the processing system 1 are realized by controlling the respective components of the processing system 1 by the control unit MC based on a program stored in the storage unit.

Figure 3:
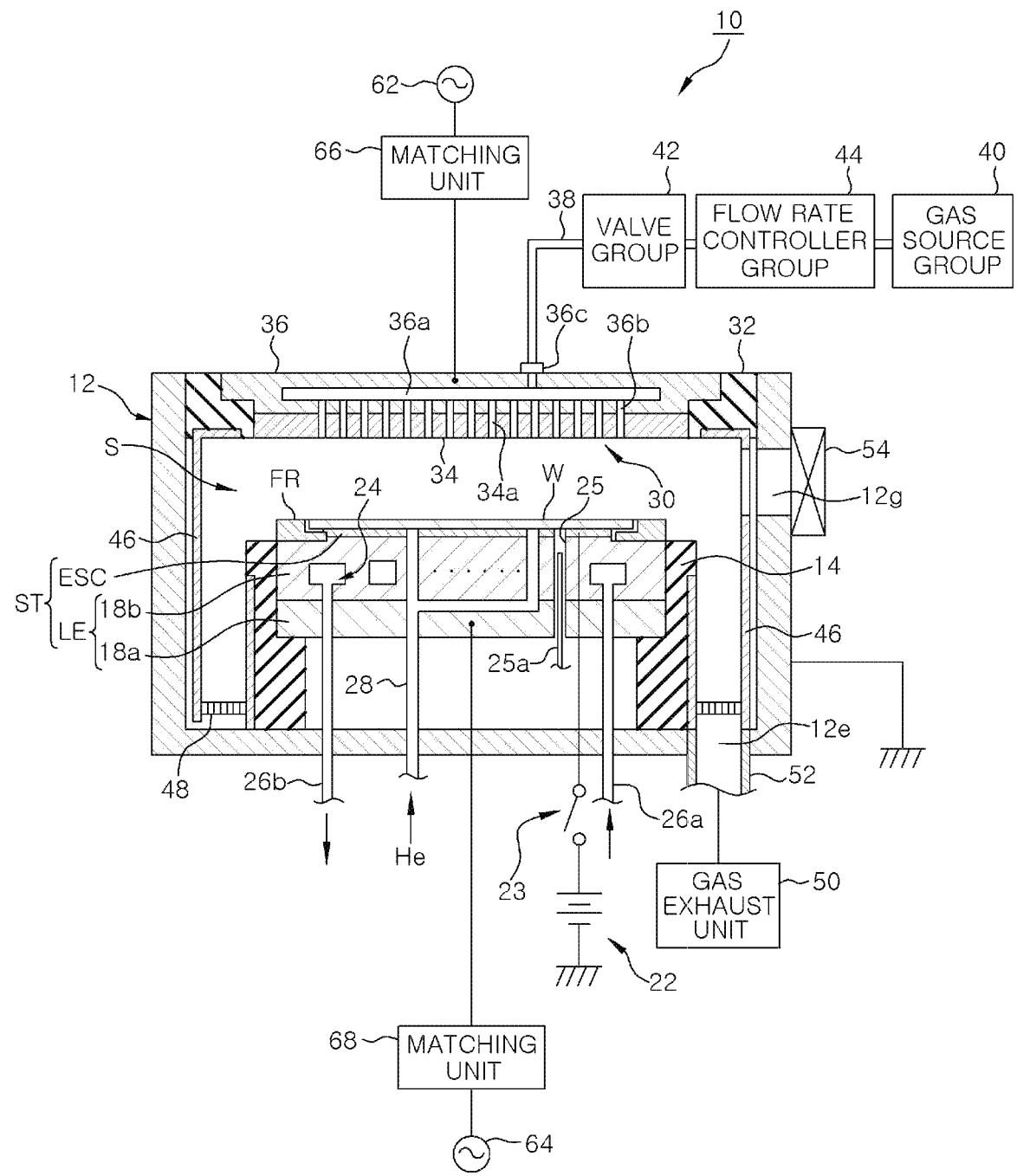
FIG. 3 shows an example of a plasma processing apparatus.

FIG. 3 shows an example of a plasma processing apparatus that may be employed as one of the process modules PM1 to PM6. The plasma processing apparatus 10 shown in FIG. 3 is a capacitively coupled plasma etching apparatus. The plasma processing apparatus 10 includes a substantially cylindrical chamber body 12. The chamber body 12 is made of, e.g., aluminum. Anodic oxidation treatment may be performed on an inner wall surface of the chamber body 12. The chamber body 12 is frame grounded.

A substantially cylindrical supporting member 14 is provided on a bottom portion of the chamber body 12. The supporting member 14 is made of, e.g. an insulating material. The supporting member 14 is provided in the chamber body 12 and extends upward from the bottom portion of the chamber body 12. A stage ST is provided in a chamber S defined by the chamber body 12 and supported by the supporting member 14.

The stage ST includes a lower electrode LE and an electrostatic chuck ESC. The lower electrode LE has a first plate 18a and a second plate 18b (mounting table). The first plate 18a and the second plate 18b are made of a metal, e.g., aluminum, and have a substantially disc shape. The second plate 18b is provided on the first plate 18a. The second plate 18b is electrically connected to the first plate 18a.

The electrostatic chuck ESC is provided on the second plate 18b. The electrostatic chuck ESC has a structure in which an electrode that is a conductive film is interposed between two insulating layers or sheets. The electrostatic chuck ESC has a substantially disc shape. A DC power supply 22 is electrically connected to the electrode of the electrostatic chuck ESC via a switch 23. The target object W is attracted and held on the electrostatic chuck ESC by electrostatic force such as Coulomb force or the like which is generated by a DC voltage from the DC power supply 22. Accordingly, the target object W can be held on the electrostatic chuck ESC.

A focus ring FR is provided on a peripheral portion of the second plate 18b. The focus ring FR surrounds an edge of the target object W and the electrostatic chuck ESC. The focus ring FR has a first portion P1 and a second portion P2 (see FIG. 6). The first portion P1 and the second portion P2 have an annular plate shape. The second portion P2 is disposed at an outer side of the first portion P1. A thickness of the second portion P2 is greater than that of the first portion P1 in a height direction. A diameter of an inner periphery P2i of the second portion P2 is greater than a diameter of an inner periphery P1i of the first portion P1. The target object W is mounted on the electrostatic chuck ESC such that the edge region thereof is positioned above the first portion P1 of the focus ring FR. The focus ring FR may be made of a material selected among silicon, silicon carbide, silicon oxide, and the like.

A coolant channel 24 is provided in the second plate 18b. The coolant channel 24 constitutes a temperature control mechanism. A coolant is supplied from a chiller unit (not shown) provided outside the chamber body 12 into the coolant channel 24 through a line 26a. The coolant supplied into the coolant channel 24 is returned to the chiller unit through a line 26b. The coolant circulates between the coolant channel 24 and the chiller unit. By controlling a temperature of the coolant, a temperature of the target object W held on the electrostatic chuck ESC is controlled.

A plurality of (e.g., three) through-holes 25 is formed through the stage ST. A plurality of (e.g., three) lift pins 25a is inserted into the through-holes 25, respectively. FIG. 3 shows one through-hole 25 into which one lift pin 25a is inserted.

The plasma processing apparatus 10 is provided with a gas supply line 28. The gas supply line 28 supplies a heat transfer gas, e.g., He gas, from a heat transfer gas supply mechanism to a gap between the upper surface of the electrostatic chuck ESC and the backside of the target object W.

The plasma processing apparatus 10 includes an upper electrode 30. The upper electrode 30 is provided above the stage ST to face the stage ST. The upper electrode 30 is supported at an upper portion of the chamber body 12 through an insulating shielding member 32. The upper electrode 30 may include a ceiling plate 34 and a holding body 36. The ceiling plate 34 faces the chamber S, and a plurality of gas injection holes 34a is formed in the ceiling plate 34. The ceiling plate 34 may be made of silicon or quartz. Alternatively, the ceiling plate 34 may be formed by forming a plasma resistant film such as yttrium oxide on a surface of an aluminum base material.

The holding body 36 detachably holds the ceiling plate 34, and may be made of a conductive material, e.g., aluminum. The holding body 36 may have a water-cooling structure. A gas diffusion space 36a is provided inside the holding body 36. A plurality of gas holes 36b communicating with the gas injection holes 34a extends downward from the gas diffusion space 36a. A gas inlet port 36c for introducing a processing gas into the gas diffusion space 36a is formed at the holding body 36. A gas supply line 38 is connected to the gas inlet port 36c.

A gas source group 40 is connected to the gas supply line 38 through a valve group 42 and a flow rate controller group 44. The gas source group 40 includes a plurality of gas sources for a plurality of gases. The valve group 42 includes a plurality of valves. The flow rate control group 44 includes a plurality of flow rate controllers such as mass flow controllers. The gas sources of the gas source group 40 are connected to the gas supply line 38 via corresponding valves of the valve group 42 and corresponding flow rate controllers of the flow rate control group 44, respectively.

In the plasma processing apparatus 10, a deposition shield 46 is detachably provided along an inner surface of a sidewall of the chamber body 12. The deposition shield 46 is also provided at an outer periphery of the supporting member 14. The deposition shield 46 prevents etching by-products (deposits) from being adhered to the chamber body 12. The deposition shield 46 may be formed by coating ceramic such as yttrium oxide or the like on an aluminum base material.

At a lower portion in the chamber body 12, a gas exhaust plate 48 is provided between the supporting member 14 and the sidewall of the chamber body 12. The gas exhaust plate 48 may be formed by coating ceramic such as yttrium oxide or the like on an aluminum base material, for example. The gas exhaust plate 48 has a plurality of through-holes penetrating therethrough in a plate thickness direction. A gas exhaust port 12e is provided at the chamber body 12 to be positioned below the gas exhaust plate 48. A gas exhaust unit 50 is connected to the gas exhaust port 12e through the gas exhaust line 52. The gas exhaust unit 50 includes a pressure control valve and a vacuum pump such as a turbo molecular pump or the like, and thus can decrease a pressure in the chamber body 12 to a desired vacuum level. A loading/unloading port 12g for the target object W is provided at the sidewall of the chamber body 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 MHz to 100 MHz, for plasma generation. The first high frequency power supply 62 is connected to the upper electrode 30 via a matching unit 66. The matching unit 66 includes a circuit for matching an output impedance of the high frequency power supply 62 and an input impedance on a load side (the upper electrode 30 side). The first high frequency power supply 62 may be connected to the lower electrode LE via the matching unit 66.

The second high frequency power supply 64 generates a second high frequency power, which has a high frequency of, e.g., 400 kHz to 13.56 MHz, for attracting ions to the target object W. The second high frequency power supply 64 is connected to the lower electrode LE via a matching unit 68. The matching unit 68 includes a circuit for matching an output impedance of the second high frequency power supply 64 and an input impedance of a load side (the lower electrode LE side).

In the plasma processing apparatus 10, a gas from one or more gas sources selected among the gas sources is supplied into the chamber S. A pressure in the chamber S is set to a predetermined pressure by the gas exhaust unit 50. The gas in the chamber S is excited by the first high frequency power from the first high frequency power supply 62 to generate plasma. The target object W is processed by active species.

If necessary, ions may be attracted to the target object W by the second high frequency power for bias of the second high frequency power supply 64.

Figure 4:
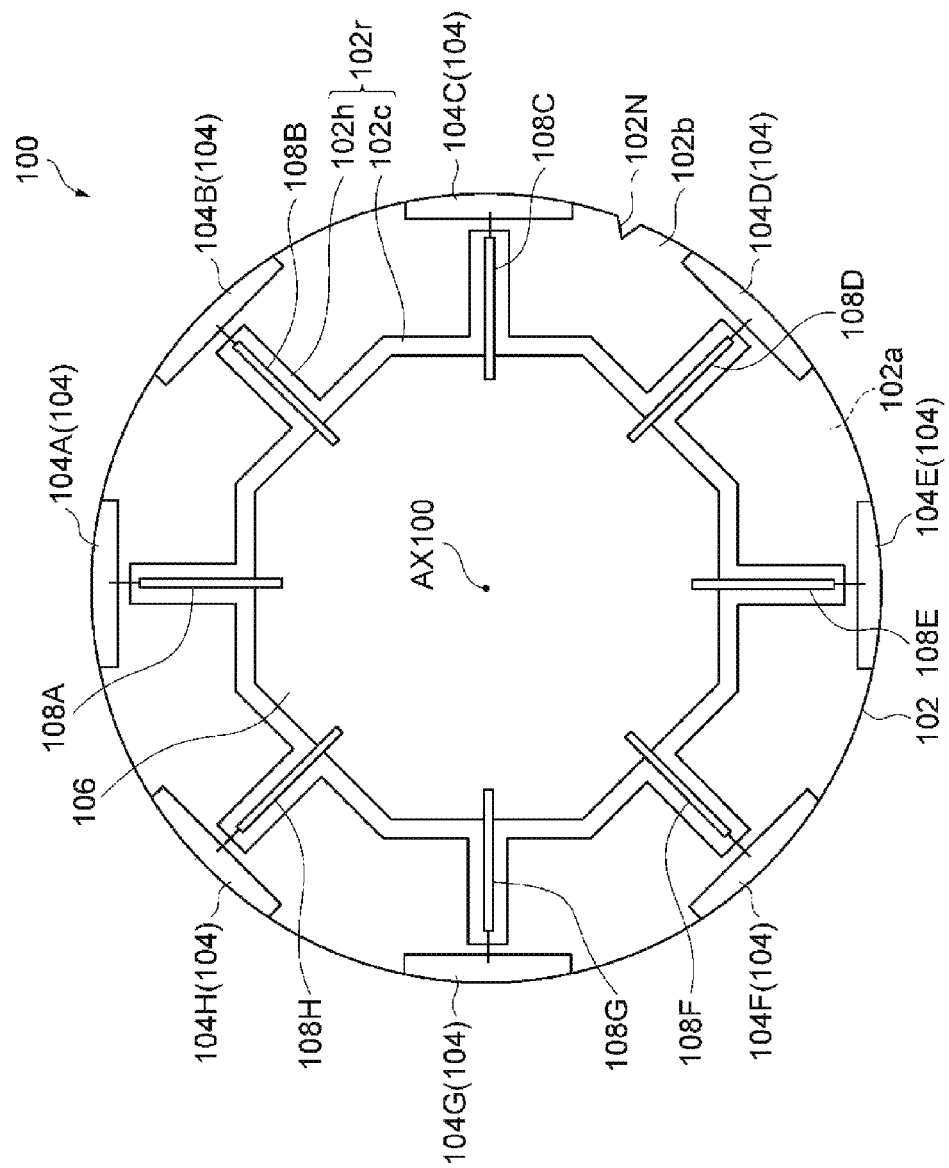
FIG. 4 is a plan view of a measuring device when viewed from the top.

Hereinafter, the measuring device will be described. FIG. 4 is a plan view of the measuring device viewed from the top. A measuring device 100 shown in FIG. 4 includes a lower part 102a, an upper part 102b, and a base substrate 102. The base substrate 102 is made of, e.g., silicon, and formed in the same shape as that of the target object W, i.e., a substantially disc shape. A diameter of the base substrate 102 is the same as that of the target object W, e.g., 300 mm. The shape and the size of the measuring device 100 may be defined by the shape and the size of the base substrate 102. Therefore, the measuring device 100 has the same shape and the same size as those of the target object W. A notch 102N (or another marker) is formed at an edge of the base substrate 102.

A plurality of sensor chips 104A to 104H is provided at the upper part 102b of the base substrate 102. The sensor chips 104A to 104H are arranged at a regular interval along the edge of the base substrate 102 in the entire circumference of the edge. In other words, the sensor chips 104A and 104E are disposed symmetrically with respect to the central axis AX100. The sensor chips 104B and 104F are disposed symmetrically with respect to the central axis AX100. The sensor chips 104C and 104G are disposed symmetrically with respect to the central axis AX100. The sensor chips 104D and 104H are disposed symmetrically with respect to the central axis AX100.

The upper surface of the upper part 102b of the base substrate 102 provides a recess 102r. The recess 102r includes a central region 102c and a plurality of radial regions 102h. The central region 102c intersects with the central axis AX100. The central axis AX100 passes through the center of the base substrate 102 in the thickness direction. A circuit board 106 is provided in the central region 102c. The radial regions 102h extend from the central region 102c in a radial direction with respect to the central axis AX 200 toward the regions where the sensor chips 104A to 104H are disposed. In the radial regions 102h, wiring groups 108A to 108H for electrically connecting the sensor chips 104A to 104H to the circuit board 106 are provided.

Figure 5:
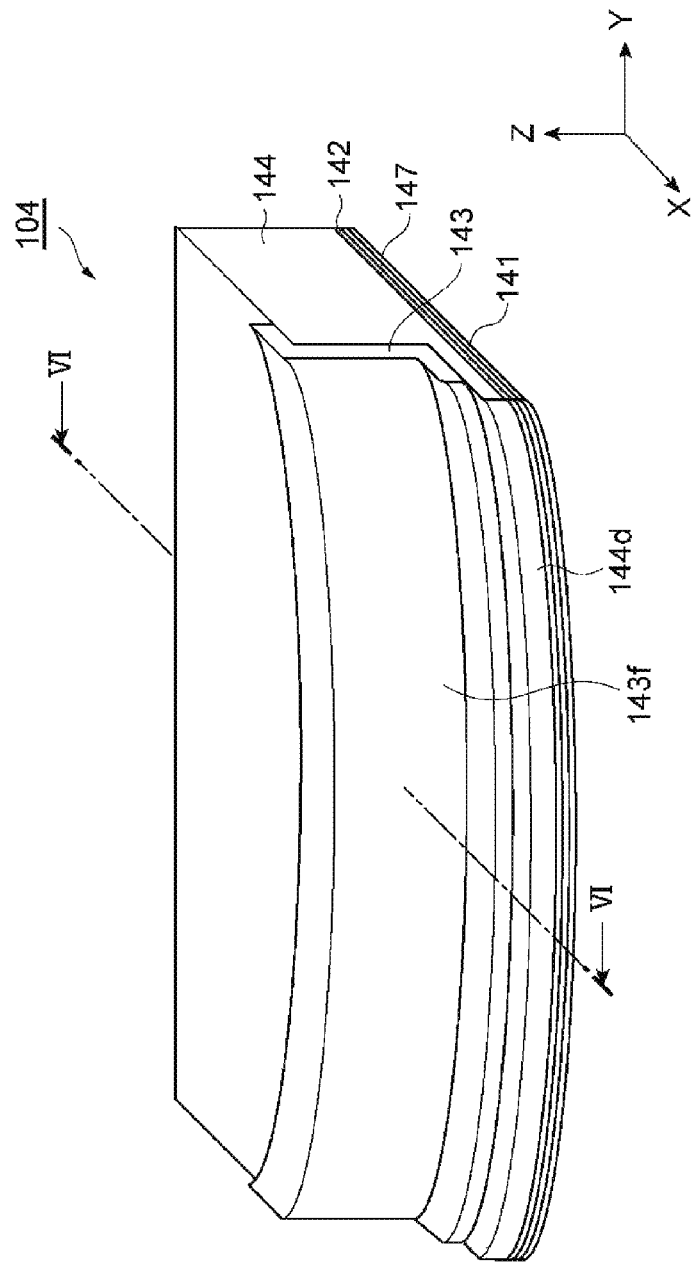
FIG. 5 is a perspective view showing an example of a sensor chip.
Figure 6:
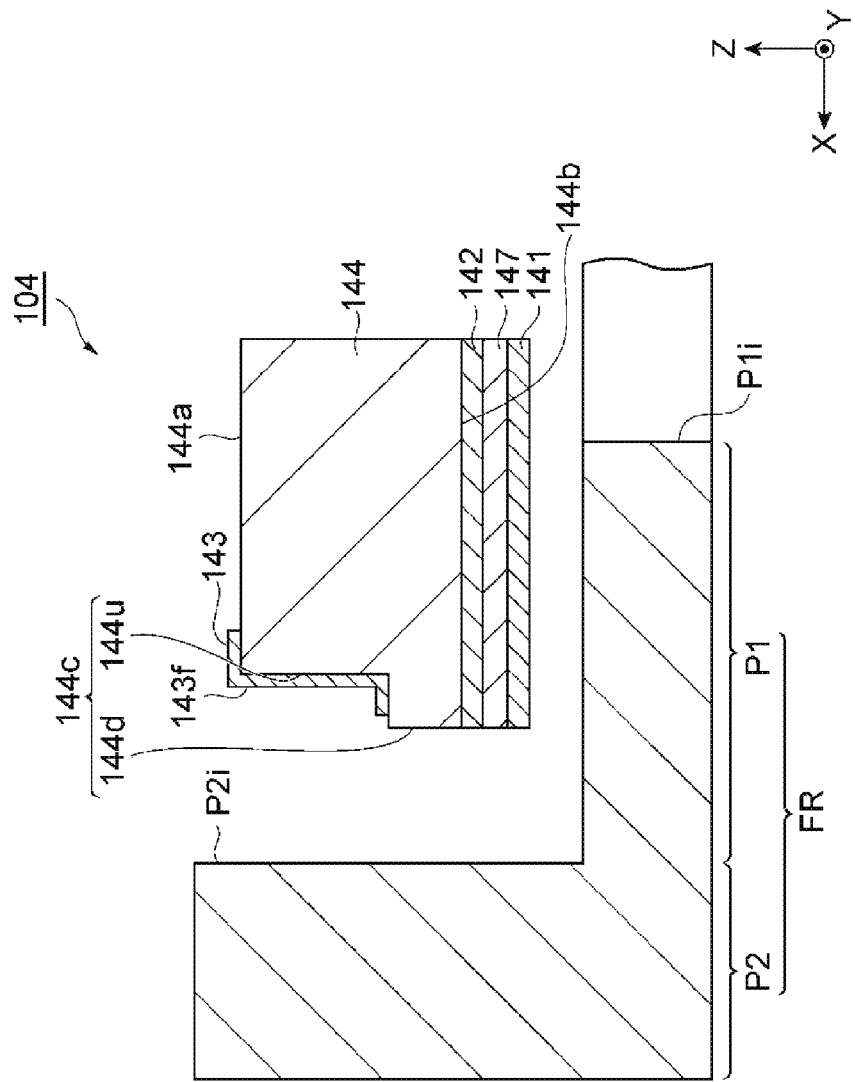
FIG. 6 is a cross sectional view taken along a line VI-VI of FIG. 5.

FIG. 5 is a perspective view of a sensor chip according to an embodiment. FIG. 6 is a cross sectional view taken along a line VI-VI of FIG. 5. The sensor chip 104 shown in FIGS. 5 and 6 is used as the sensor chips 104A to 104H of the measuring device 100. In the following description, the XYZ orthogonal coordinate system will be appropriately referred to. The X direction indicates a frontward direction of the sensor chip 104. The Y direction indicates a width direction of the sensor chip 104 which is orthogonal to the X direction. The Z direction indicates an upward direction of the sensor chip 104 which is orthogonal to the X direction and the Y direction.

The sensor chip 104 includes an electrode 141, a guard electrode 142, a sensor electrode 143, a substrate member 144, and an insulating region 147.

The substrate member 144 is made of, e.g., borosilicate glass or quartz. The substrate member 144 has an upper surface 144a, a bottom surface 144b, and a front end surface 144c. The guard electrode 142 is provided below the bottom surface 144b of the substrate member 144 and extends in the X direction and the Y direction. The electrode 141 is provided below the guard electrode 142 with the insulating region 147 interposed therebetween, and extends in the X direction and the Y direction. The insulating region 147 is made of, e.g., $SiO_2$, SiN, $Al_2O_3$, or polyimide.

The front end surface 144c of the substrate member 144 is formed in a stepped shape. A lower portion 144d of the front end surface 144c protrudes toward the focus ring FR compared to an upper portion 144u of the front end surface 244c. The sensor electrode 143 extends along the upper portion 144u of the front end surface 244c. In one embodiment, the upper portion 144u and the lower portion 144d of the front end surface 144c may be curved surfaces having predetermined curvatures. In other words, the upper portion 144u of the front end surface 144c has a constant curvature at any position thereof, and the curvature of the upper portion 144u is a reciprocal of a distance between the central axis AX100 of the measuring device 100 and the upper portion 144u of the front end surface 144c. The lower portion 144d of the front end surface 144c has a constant curvature at any position thereof, and the curvature of the lower portion 144d is a reciprocal of a distance between the central axis AX100 of the measuring device 100 and the lower part 144d of the front end surface 144c.

The sensor electrode 143 is provided along the upper portion 144u of the front end surface 144c. In one embodiment, a front surface 143f of the sensor electrode 143 is a curved surface. In other words, the front surface 143f of the sensor electrode 143 has a constant curvature at any position thereof, and the curvature of the front surface 143f is a reciprocal of a distance between the central axis AX100 of the measuring device 100 and the front surface 143f.

In the case of using the sensor chip 104 as a sensor of the measuring device 100, the electrode 141 is connected to the wiring 181; the guard electrode 142 is connected to the wiring 182; and the sensor electrode 143 is connected to the wiring 183, which will be described later.

In the sensor chip 104, the sensor electrode 143 is shielded from the bottom of the sensor chip 104 by the sensor electrode 143, the electrode 141, and the guard electrode 142. Therefore, in accordance with the sensor chip 104, the electrostatic capacitance can be measured with high directivity in a specific direction (X direction) in which the front surface 143f of the sensor electrode 143 is directed.

Figure 7:
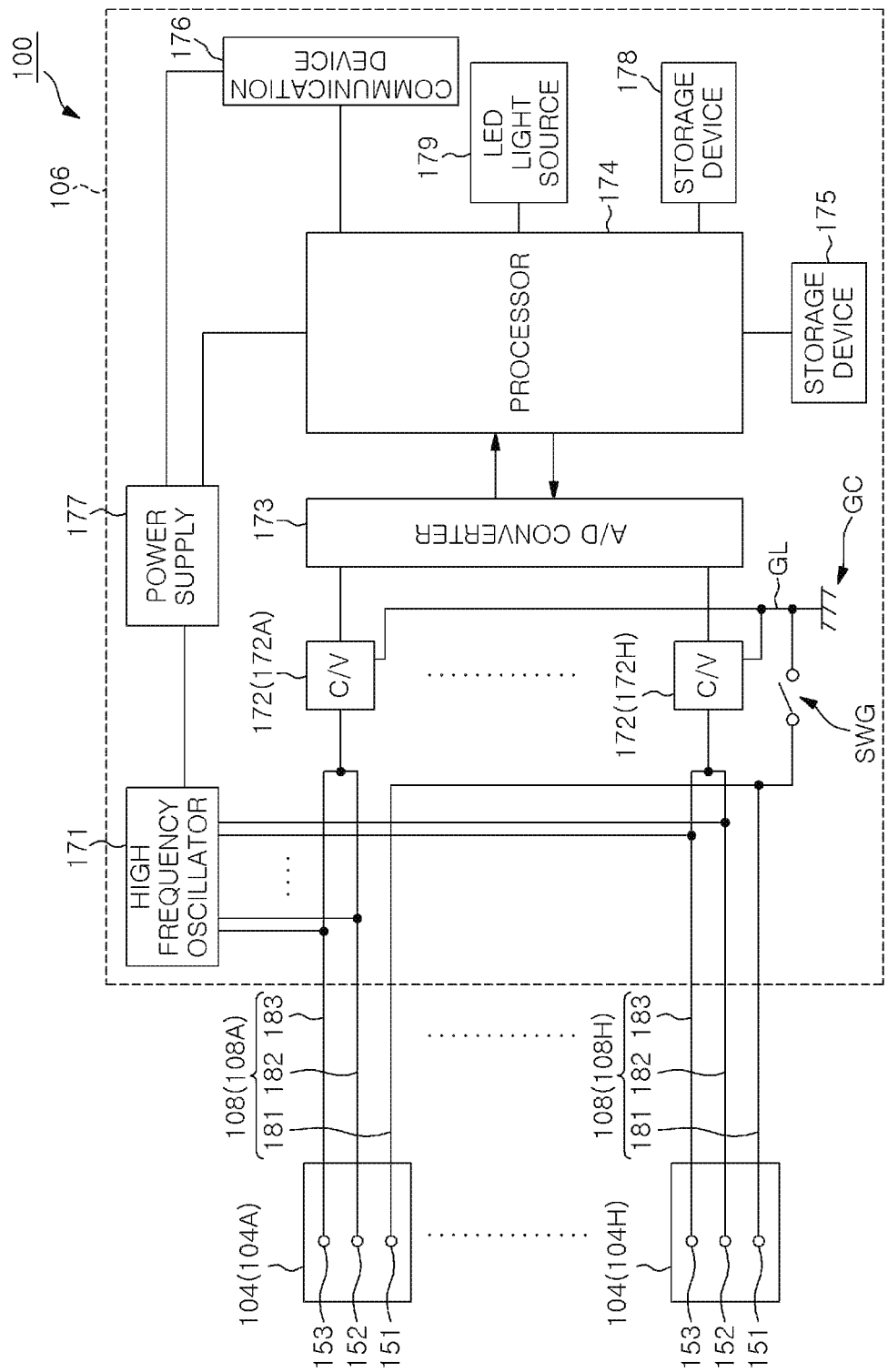
FIG. 7 shows an example of a configuration of a circuit board of the measuring device.

Hereinafter, the configuration of the circuit board 106 will be described. FIG. 7 shows an example of the configuration of the circuit board of the measuring device 10. As illustrated in FIG. 7, the circuit board 106 includes a high frequency oscillator 171, a plurality of C/V conversion circuits 172A to 172H, a switching mechanism 190, an A/D converter 173, a processor (operation unit) 174, a storage device 175, a communication device 176, and a power supply 177.

Each of the sensor chips 104A to 104H is connected to the circuit board 106 through a corresponding wiring group among the wiring groups 108A to 108C. Further, each of the sensor chips 104A to 104H is connected to a corresponding C/V conversion circuit among the C/V conversion circuits 172A to 172H through some wirings included in the corresponding wiring group. The following is description on a single sensor chip 104 having the same configuration as that of each of the sensor chips 104A to 104H, a single wiring group 108 having the same configuration as that of each of the wiring groups 108A to 108H, a single C/V conversion circuit 172 having the same configuration as that of each of the C/V conversion circuits 172A to 172H, and the switching mechanism 190.

The wiring group 108 includes wirings 181 to 183. One end of the wiring 181 is connected to a pad 151 connected to the electrode 141. The wiring 181 is connected to a ground potential line GL connected to a ground G of the circuit board 106. The wiring 181 may be connected to the ground potential line GL via a switch SWG. One end of the wiring 182 is connected to a pad 152 connected to the guard electrode 142, and the other end of the wiring 182 is connected to the C/V conversion circuit 172. One end of the wiring 183 is connected to a pad 153 connected to the sensor electrode 143, and the other end of the wiring 183 is connected to the C/V conversion circuit 172.

The high frequency oscillator 171 is connected to the power supply 177 such as a battery. The high frequency oscillator 171 is configured to receive power from the power supply 177 and generate a high frequency signal. The power supply 177 is also connected to the processor 174, the storage device 175, and the communication device 176. The high frequency oscillator 171 has a plurality of output lines. The high frequency oscillator 171 is configured to apply the generated high frequency signal to the wirings 182 and 183 through the output lines. Therefore, the high frequency oscillator 171 is electrically connected to the guard electrode 142 and the sensor electrode 143 of the sensor chip 104, and the high frequency signal from the high frequency oscillator 171 is applied to the guard electrode 142 and the sensor electrode 143.

The wirings 182 and 183 are connected to an input of the C/V conversion circuit 172. In other words, the guard electrode 142 and the sensor electrode 143 of the sensor 104 are connected to the input of the C/V conversion circuit 172. The C/V conversion circuit 172 is configured to generate a voltage signal having an amplitude corresponding to the potential difference at the input thereof and output the corresponding voltage signal. As the electrostatic capacitance of the sensor electrode connected to the C/V conversion circuit 172 is increased, the magnitude of the voltage signal outputted from the C/V conversion circuit 172 is increased.

The output of the C/V conversion circuit 172 is connected to the input of the A/D converter 173. The A/D converter 173 is connected to the processor 174. The A/D converter 173 is controlled by a control signal from the processor 174. The A/D converter 173 converts the output signal (voltage signal) of the C/V conversion circuit 172 to a digital value and outputs the digital value as a detection value to the processor 174.

The storage device 175 is connected to the processor 174. The storage device 175 is, e.g., a volatile memory, and is configured to store measurement data to be described later. Another storage device 178 is connected to the processor 174. The storage device 178 is, e.g., a nonvolatile memory, and is configured to store a program that is read out and executed by the processor 174.

The communication device 176 conforms to any wireless communication standard. For example, the communication device 176 conforms to Bluetooth (registered trademark). The communication device 176 is configured to wirelessly transmit the measurement data stored in the storage device 175.

The processor 174 is configured to control the respective components of the measuring device 100 by executing the above-described program. For example, the processor 174 is configured to control the supply of the high frequency signal from the high frequency oscillator 171 to the guard electrode 142, the sensor electrode 143 and the electrode 141, the supply of power from the power supply 177 to the storage device 175, the supply of power from the power supply 177 to the communication device 176, and the like. Further, the processor 174 executes the above-described program to acquire the measurement value of the sensor chip 104 based on the detection value inputted from the A/D converter 173.

Further, the processor 174 may derive the amount of consumption of the focus ring FR with reference to a table based on the measurement value acquired by the sensor chip 104. The amount of consumption can be defined as, e.g., the amount of decrease in the thickness in the height direction of the second portion P2 in the focus ring FR. The table includes data in which the amount of consumption of the focus ring FR is associated with a representative value of a plurality of measurement values corresponding to the amount of consumption. In one embodiment, the representative value is an average value of a plurality of measurement values acquired in a state where the measuring device 100 is mounted on the central portion of the mounting region in the focus ring FR. The table can be created by acquiring, as the representative value, the average value of the measurement values corresponding to the amounts of consumption of the focus ring FR which are varied by a predetermined amount. The table may be stored in, e.g., the storage device 175. The representative value in the data of the table tends to be decreased as the amount of consumption of the focus ring FR is increased. In one example, the processor 174 acquires a plurality of measurement values in a state in which the measuring device 100 is mounted on the central portion of the mounting region inside the focus ring FR. Then, the processor 174 calculates an average value of the measurement values. Further, the processor 174 derives the amount of consumption of the focus ring FR which is associated with the average value with reference to the table.

In one embodiment, a notification device that performs predetermined notification based on the amount of consumption of the focus ring FR may be provided on the circuit board 106. The notification device may be, e.g., an LED light source 179. The LED light source 179 is connected to the circuit board 106 and operates by a signal from the processor 174. The LED light source 179 is provided at a position that can be visually recognized from the outside of the measuring device 100. For example, if it is determined by the processor 174 that the amount of consumption of the focus ring FR exceeds a predetermined threshold value, the LED light source 179 may be turned on to notify a user of the replacement of the focus ring FR.

In the measuring device 100, the sensor electrodes 143 and the guard electrodes 142 face the inner periphery of the focus ring FR in a state where the measuring device 100 is disposed in a region surrounded by the focus ring FR. The measurement value generated based on the potential difference between the signal of the sensor electrode 143 and the signal of the guard electrode 142 indicates an electrostatic capacitance that reflects the distance between each of the sensor electrodes 143 and the focus ring. The electrostatic capacitance C is represented by $C=\varepsilon S/d$. "$\varepsilon$" represents a dielectric constant of a medium between the front surface 143$f$ of the sensor electrode 143 and the inner periphery of the focus ring FR; "S" represents an area of the front surface 143$f$ of the sensor electrode 143; and "d" represents a distance between the front surface 143$f$ of the sensor electrode 143 and the inner periphery of the focus ring FR. Therefore, in accordance with the measuring device 100, the measurement data that reflects the relative positional relation between the focus ring FR and the measuring device 100 that imitates the target object W can be obtained. For example, the plurality of measurement values obtained by the measuring device 100 is decreased as the distance between the front surface 143$f$ of the sensor electrode 143 and the inner periphery of the focus ring FR is increased.

The following is description on an example of a method for obtaining the amount of deviation of the central position (central axis AX100) of the measuring device 100 disposed in a region surrounded by the focus ring FR with respect to the central position (central axis AXF) of the corresponding region.

Figure 8:
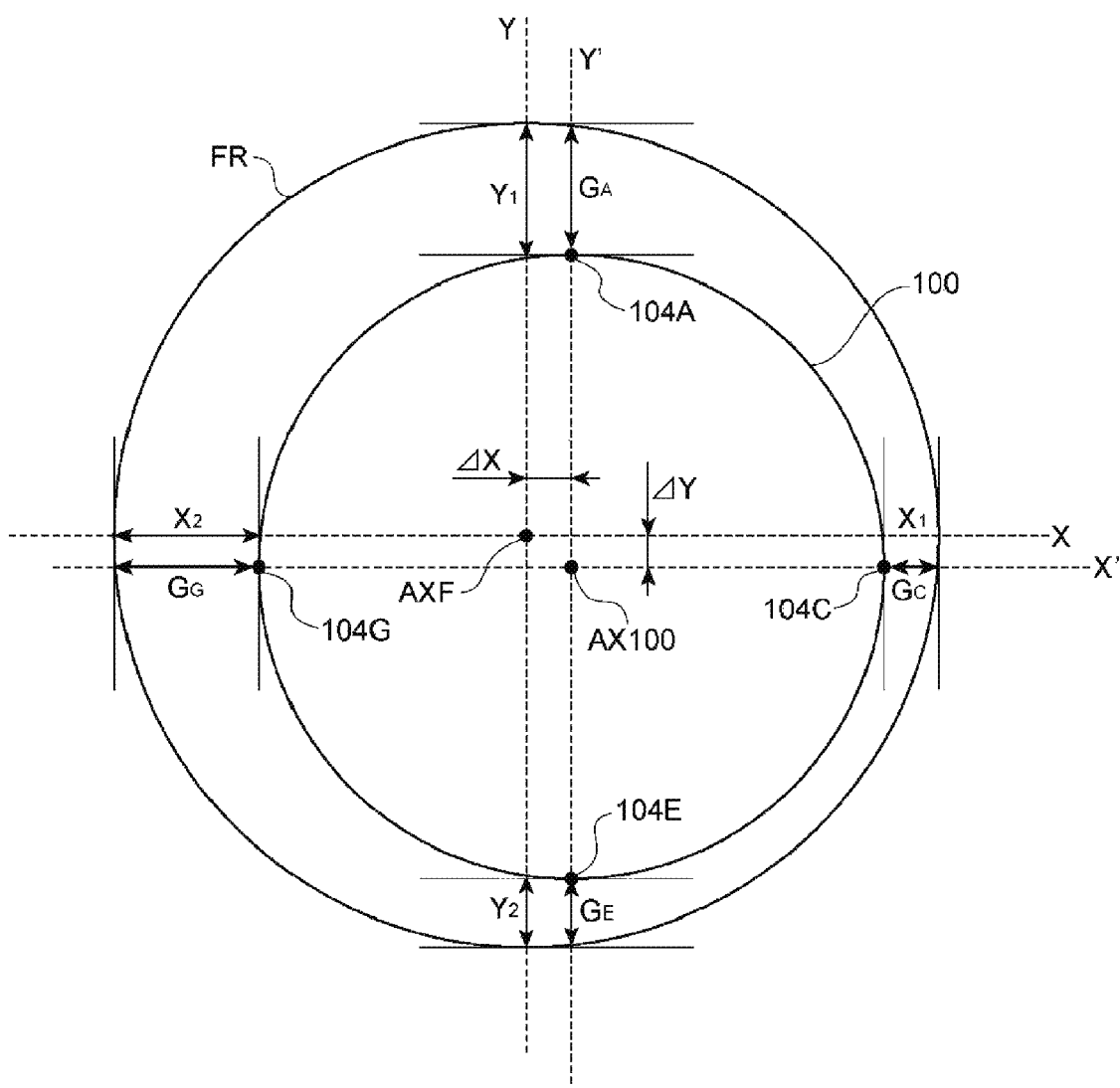
FIG. 8 schematically shows positional relation between a focus ring and the measuring device.

FIG. 8 schematically shows positional relation between the focus ring FR and the measuring device 100 disposed at an inner side of the focus ring FR. In FIG. 8, an inner periphery of the focus ring FR and an edge of the measuring device 100 are shown. Further, in FIG. 8, an orthogonal coordinate system having the X-axis and the Y-axis with the central position of the focus ring FR as the origin and an orthogonal coordinate system having the X'-axis and the Y'-axis with the central position of the measuring device 100 as the origin are shown. In the illustrated example, the Y'-axis is set to pass through the sensor chips 104A and 104E and the central position. Further, the X'-axis is set to pass through the sensor chips 104C and 104G and the central position. In the following method, the amount of deviation $\Delta Y$ of the central position of the measuring device 100 in the Y-axis direction is calculated based on the sensor chips 104A and 104E, and the amount of deviation $\Delta X$ of the central position of the measuring device 100 in the X-axis direction is calculated based on the sensor chips 104C and 104G. Therefore, in FIG. 8, the other sensor chips 104B, 104D, 104F, and 104H are not illustrated.

Hereinafter, a method of deriving $\Delta X$ and $\Delta Y$ will be described. In the present embodiment, in the sensor chips 104A and 104E, the sum of the shortest distances from the sensor electrodes 143 to the inner peripheral surface of the focus ring FR becomes a constant value. Further, in the sensor chips 104C and 104G, the sum of the shortest distances from the sensor electrodes 143 to the inner peripheral surface of the focus ring FR becomes a constant value. In the illustrated example, an inner diameter $D_f$ of the focus ring FR is 302 mm and an outer diameter $D_w$ of the measuring device 100 is 300 mm. In that case, on the assumption that the shortest distances from the sensor chips 104A, 104C, 104E and 104G to the inner periphery of the focus ring FR are respectively $G_A$, $G_C$, $G_E$ and $G_G$, the following Eqs. (1) and (2) are satisfied.

$$G_A + G_E = 2.00 \text{ mm} \qquad \text{Eq. (1)}$$

$$G_C + G_G = 2.00 \text{ mm} \qquad \text{Eq. (2)}$$

On the assumption that the measurement values (electrostatic capacitances) of the sensor chips 104A, 104C, 104E and 104G are respectively $C_A$, $C_C$, $C_E$ and $C_G$, conditions $G_A = a/C_A$, $G_C = a/C_C$, $G_E = a/C_E$, and $G_G = a/C_G$ are satisfied. In other words, the above Eqs. (1) and (2) are converted to the following Eqs. (3) and (4).

$$(a/C_A) + (a/C_E) = 2.00 \text{ mm} \qquad \text{Eq. (3)}$$

$$(a/C_C) + (a/C_G) = 2.00 \text{ mm} \qquad \text{Eq. (4)}$$

In the case of deriving $\Delta X$ and $\Delta Y$, first, the measurement values $C_A$, $C_C$, $C_E$ and $C_G$ are acquired. By substituting the measurement values $C_A$, $C_C$, $C_E$ and $C_G$ into the above Eqs. (3) and (4), the constant "a" can be obtained. The measurement values $G_A$, $G_C$, $G_E$ and $G_G$ are derived from the constant "a" and the respective measurement values $C_A$, $C_C$, $C_E$ and $C_G$.

Since $\Delta Y$ can be defined as ½ of the difference between $Y_2$ and $Y_1$, $\Delta Y$ is obtained from the distances $G_A$ and $G_E$ as shown in the following Eq. (5).

$$\Delta Y = (G_E - G_A)/2 \qquad \text{Eq. (5)}$$

Similarly, since $\Delta X$ can be defined as ½ of the difference between $X_2$ and $X_1$, $\Delta X$ is obtained from the distances $G_C$ and $G_D$ as in the following Eq. (6).

$$\Delta X = (G_G - G_C)/2 \qquad \text{Eq. (6)}$$

As described above, in the present embodiment, the amount of deviation between the central position of the focus ring FR and the central axis AX100 of the measuring device 100 disposed at the inner side of the focus ring FR can be calculated as the amount of deviation $\Delta X$ in the X-axis direction and the amount of deviation $\Delta Y$ in the Y-axis direction.

Figure 9:
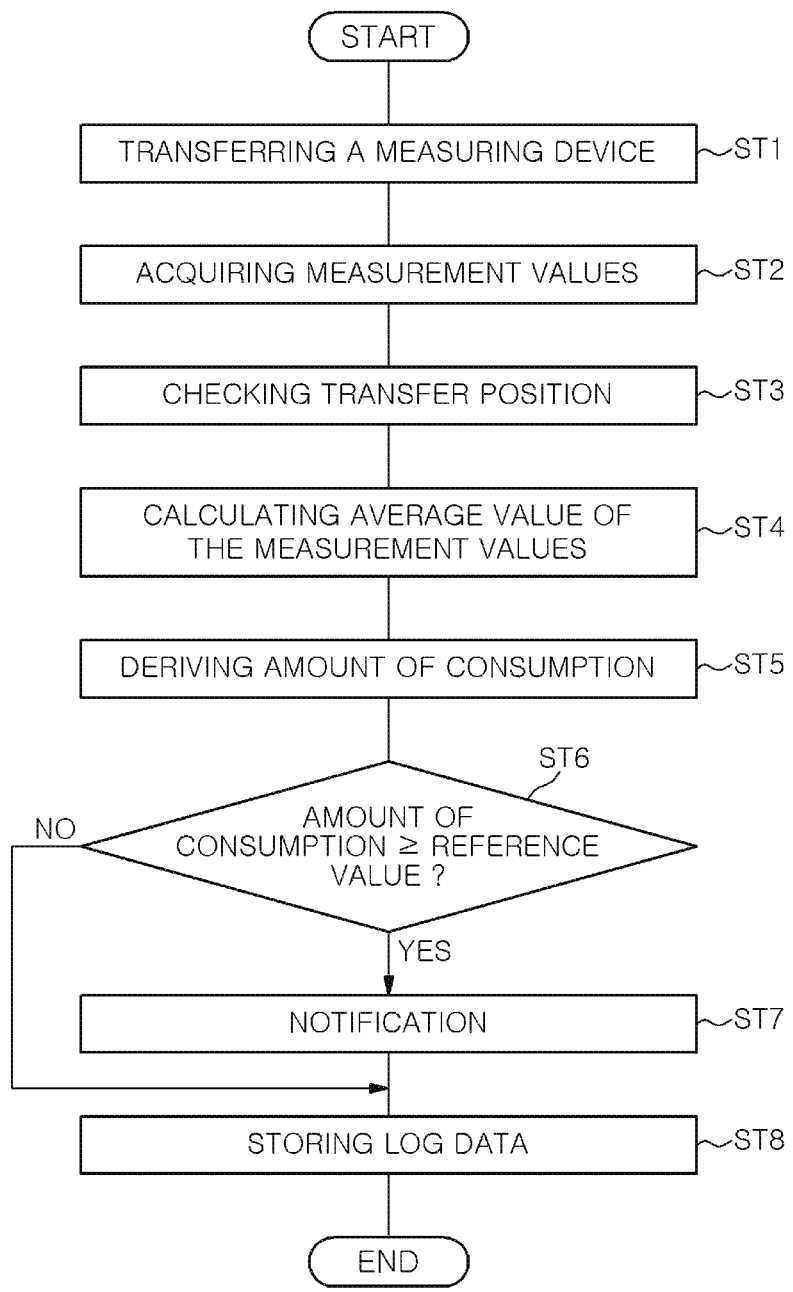
FIG. 9 is a flowchart showing one embodiment of an operation method of a system for inspecting the focus ring.

Hereinafter, an operation method of a system (the processing system 1 and the measuring device 100) for inspecting the focus ring by using the measuring device 100 will be de described. As described above, the transfer unit TU2 in the processing system 1 is controlled by the control unit MC. In one embodiment, the transfer unit TU2 can transfer the target object W and the measuring device 100 onto the mounting region surrounded by the focus ring FR based on the transfer position data transmitted from the control unit MC. FIG. 9 is a flowchart showing the operation method of the system for inspecting the focus ring according to an embodiment.

In the method shown in FIG. 9, first, a step ST1 is executed. In the step ST1, the measuring device 100 is transferred by the transfer unit TU2 to the position on the mounting region specified by the transfer position data. Specifically, the transfer unit TU1 transfers the measuring device 100 to one of the load-lock modules LL1 and LL2. Then, based on the transfer position data, the transfer unit TU2 transfers the measuring device 100 from one of the load-lock modules to any one of the process modules PM1 to PM6, and mounts the measuring device 100 on the mounting region of the electrostatic chuck ESC. The transfer position data are coordinate data that are determined in advance such that the position of the central axis AX100 of the measuring device 100 coincides with the central position of the focus ring FR or the mounting region R. The operator can select, as the reference of the central position, one of the focus ring FR and the mounting region R.

Next, in a step ST2, the measuring device 100 measures an electrostatic capacitance. Specifically, the measuring device 100 acquires a plurality of digital values (measurement values) corresponding to the magnitudes of the electrostatic capacitances between the focus ring FR and the sensor electrodes 143 of the sensor chips 104A to 104H, and stores the digital values in the storage device 175. The digital values may be acquired at a predetermined timing under the control of the processor 174.

Next, in a step ST3, the amount of deviation between the central position of the focus ring FR and the central position of the measuring device 100 is derived from the measurement value acquired in the step ST2 using the above-described method of obtaining the amount of deviation. In the step ST3 of one embodiment, first, a plurality of digital values stored in the storage device 175 is transmitted to the control unit MC. Next, the control unit MC derives the amount of deviation of the transfer position of the measuring device 100 based on the received digital values. When it is determined by the control unit MC that the amount of deviation is smaller than or equal to the predetermined threshold value, it is determined that the measuring device 100 has been transferred to the central position of the region inside the focus ring FR and, thus, the processing proceeds to a step ST4. On the other hand, when it is determined by the control unit MC that the amount of deviation is greater than the predetermined threshold value, the transfer position data is calibrated by the control unit MC to eliminate the amount of deviation, and the processes from the step ST1 may be repeated.

In a step ST4, an average value of the measurement values acquired by the measuring device 100 transferred to the central position of the region inside the focus ring FR is calculated. Specifically, the measuring device 100 acquires a plurality of measurement values corresponding to the magnitudes of the electrostatic capacitances between the focus ring FR and the sensor electrodes 143 of the sensor chips 104A to 104H. The measuring device 100 stores the measurement values in the storage device 175. Then, the average value of the measurement values stored in the storage device 175 is calculated. In one example, the average value is calculated by the processor 174 of the measuring device 100. In another example, the average value may be calculated by the control unit MC.

Next, in a step ST5, the amount of consumption of the focus ring FR which corresponds to the average value calculated in the step ST4 is derived. In one embodiment, the processor 174 derives the amount of consumption corresponding to the average value with reference to the table stored in the storage device 175. In another example, the control unit MC may drive the amount of consumption with reference to the table stored in the control unit MC which is the same as the table stored in the storage device 175.

Next, in a step ST6, the amount of consumption derived in the step ST5 is compared with a predetermined reference value. In one embodiment, the reference value is the amount of the consumption as the criterion for replacing the focus ring FR. When it is determined that the amount of consumption is greater than or equal to the reference value, the processing proceeds to a step ST7. When it is determined that the amount of consumption is smaller than the reference value, the processing proceeds to a step ST8.

In the step ST7, predetermined notification is performed based on the derived amount of consumption of the focus ring. In one embodiment, the LED light source 179 of the measuring device 100 is turned on to notify a user of the replacement of the focus ring FR. For example, when the control unit MC includes an output device such as a display or the like, the output device may notify the replacement of the focus ring FR.

Next, in a step ST8, at least one of the measurement value, the average value, and the amount of consumption is stored as log data. In one embodiment, data indicating whether or not the amount of consumption is greater than or equal to the reference value is stored as log data, in addition to the measurement value, the average value and the amount of consumption, in the storage device 175. The log data may be stored in the memory of the control unit MC.

The sequence including the steps ST1 to ST8 can be executed periodically. In one embodiment, the sequence can be executed whenever the processing of target objects W of one lot in the processing system 1 is completed. The sequence execution timing may be set by the user.

In the above-described measuring device 100, the detection values acquired from the sensor electrodes 143 indicate the electrostatic capacitances between the sensor electrodes 143 and the focus ring FR disposed in front of the sensor electrodes 143. The electrostatic capacitance is in inverse proportion to the distance between the sensor electrode 143 and the focus ring FR. When the focus ring FR is consumed by the processing on the target object W, the distance between the focus ring FR and the sensor electrode 143 is increased. In other words, the detection values acquired from the sensor electrodes 143 are decreased as the amount of consumption of the focus ring FR is increased. The table includes the amount of consumption of the focus ring FR and a representative value of the measurement values corresponding to the amount of consumption. Therefore, the amount of consumption of the focus ring FR can be derived from the average value of the measurement values with reference to the table.

By performing the notification based on the amount of consumption of the focus ring FR, the user can easily recognize the amount of consumption of the focus ring FR. Particularly, when the amount of consumption at the time of notification is associated with the replacement timing, the user can easily recognize the replacement timing of the focus ring FR.

The sequence for inspecting the amount of consumption of the focus ring FR may be executed periodically. By executing the sequence periodically, it is possible to periodically recognize the amount of consumption of the focus ring FR. In addition, it is possible to reliably perform the inspection of the focus ring FR.

By storing at least one of the measurement value, the average value and the amount of consumption as the data log in the memory, it is possible to acquire data for analyzing the temporal changes of the measurement value, the average value and the amount of consumption.

While the embodiments have been described above, the present disclosure can be variously modified without being limited to the above-described embodiments.

Figure 10:
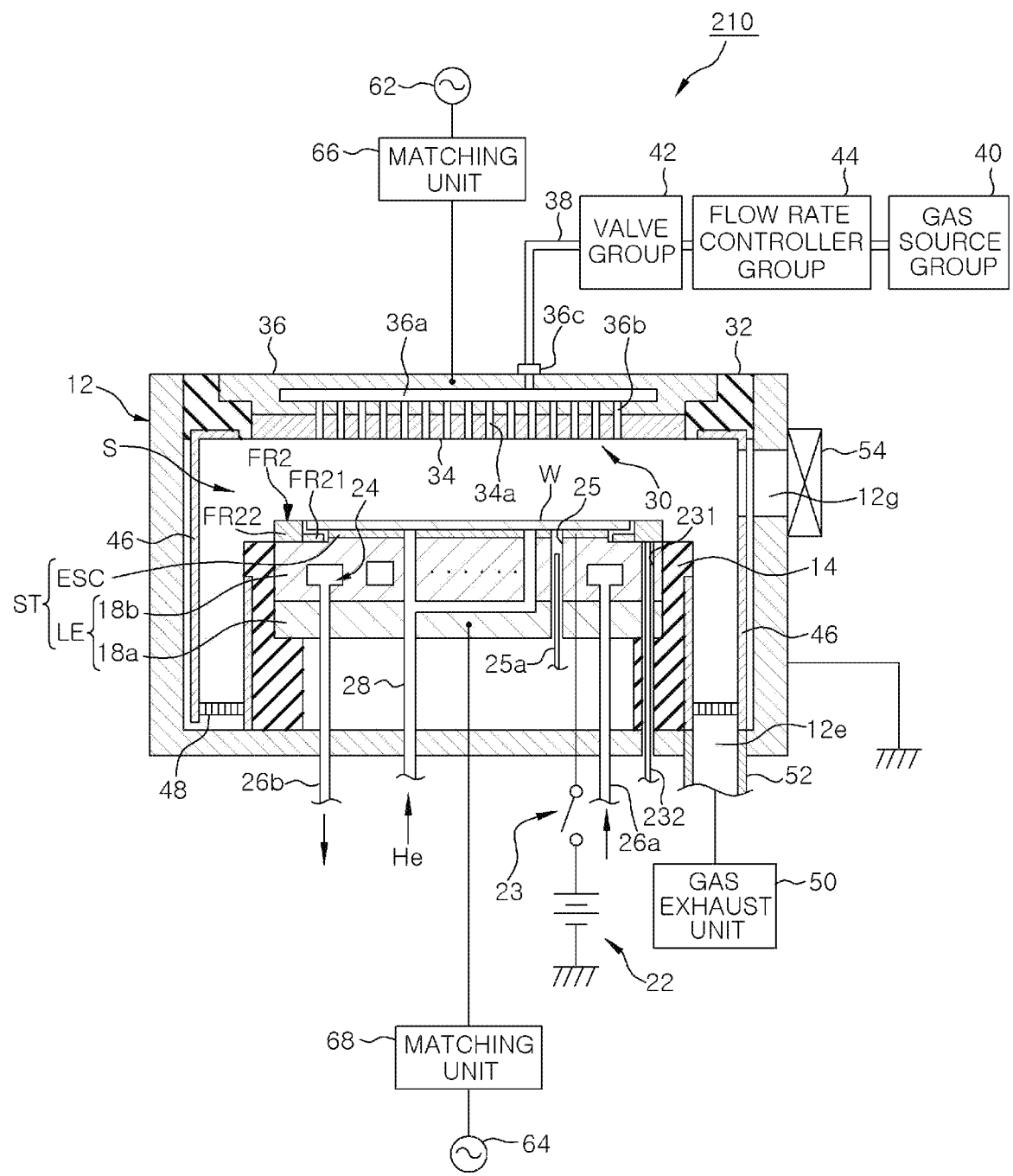
FIGS. 10 and 11 show examples of a plasma processing apparatus.

For example, the processing system may adjust the height of the focus ring based on the derived amount of consumption of the focus ring. In such a processing system 1, a plasma processing apparatus 210 shown in FIG. 10 is used, for example. The plasma processing apparatus 210 is different from the plasma processing apparatus 10 in the shape of the focus ring FR. Further, the plasma processing apparatus 210 is different from the plasma processing apparatus 10 in that it includes a lifting mechanism. The other configurations of the plasma processing apparatus 210 are the same as those of the plasma processing apparatus 10.

A focus ring FR2 in the plasma processing apparatus 210 has a shape in which the first portion P1 and the second portion P2 in the focus ring FR of the plasma processing apparatus 10 are separated. In other words, the focus ring FR2 has an inner ring body FR21 formed in a shape corresponding to the first portion P1 and an outer ring body FR22 formed in a shape corresponding to the second portion P2. A diameter of an inner periphery of the outer ring body FR 22 is greater than that of the target object W.

The lifting mechanism has a lift pin 232 inserted into a through-hole 231 formed in the lower electrode LE and the supporting member 14. The through-hole 231 is formed at a position that is overlapped with the outer ring body FR22 of the focus ring FR2 when viewed from the top. The lift pin 232 is connected to, e.g., an actuator, and is vertically movable. In one embodiment, the lift pin 232 is moved up under the control of the control unit MC and, thus, the outer ring body FR22 of the focus ring FR2 is raised by the lift pin 232.

In one embodiment, the height of the outer ring body FR22 is controlled such that the interface between the plasma and the sheath which are formed above the target object W and the focus ring FR2 becomes flat. For example, when the amount of consumption of the focus ring FR 2 is measured, the control unit MC controls the outer ring body FR22 to be raised by a height corresponding to the measured amount of consumption.

Figure 11:
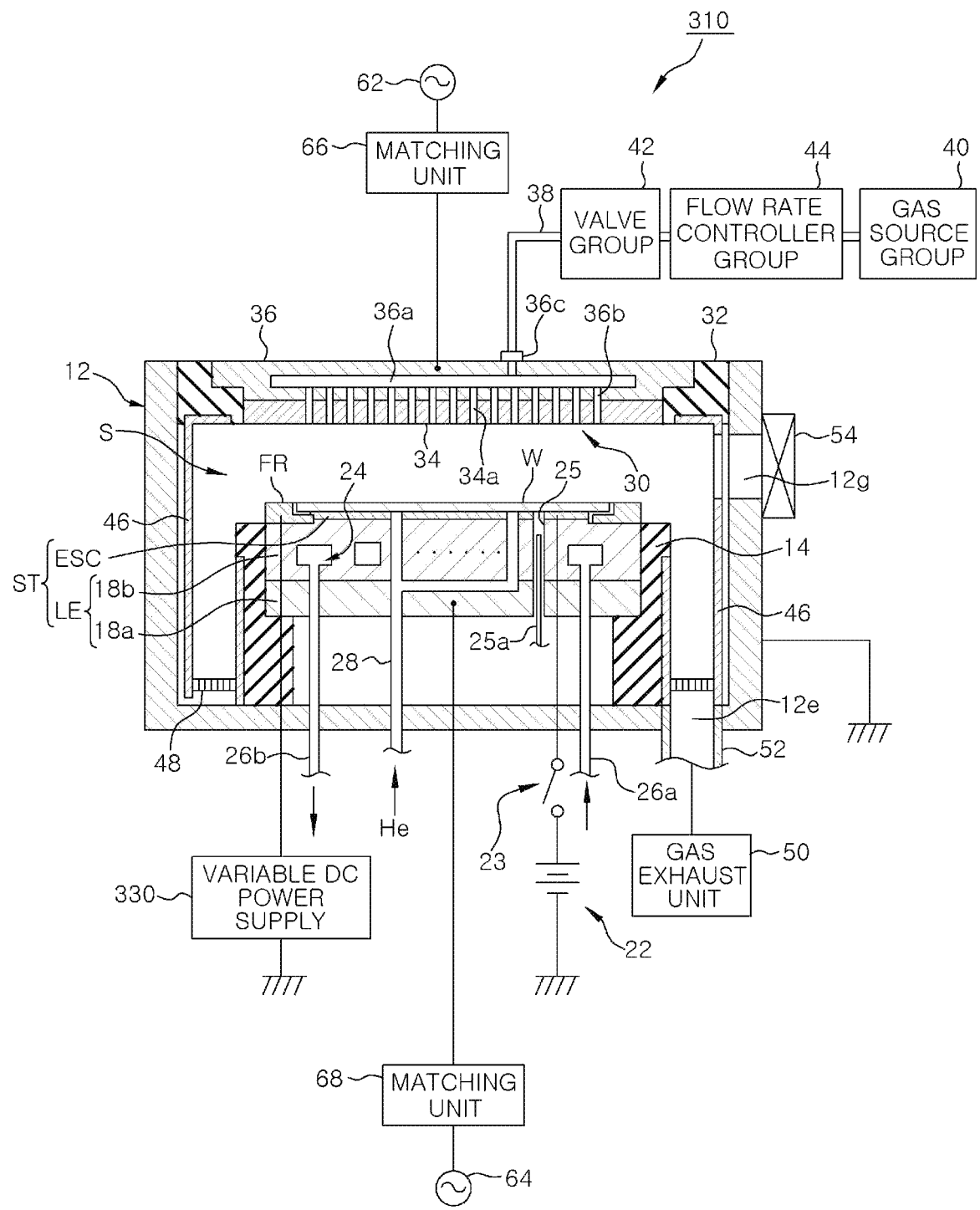

Further, the processing system may apply a negative DC voltage to the focus ring based on the amount of consumption of the focus ring. In such a processing system, a plasma processing apparatus 310 shown in FIG. 11 is used, for example. The plasma processing apparatus 310 is different from the plasma processing apparatus 10 in that it further includes a variable DC power supply 330. The other configurations of the plasma processing apparatus 310 are the same as those of the plasma processing apparatus 10. The variable DC power supply 330 is electrically connected to the focus ring FR. The variable DC power supply 330 is configured to be able to apply a negative DC voltage to the focus ring FR. The variable DC power supply 330 generates a negative DC voltage to be applied to the focus ring FR in order to adjust the state of the plasma generated in the chamber S. The variable DC power supply 330 is controlled by the control unit MC, for example.

In one embodiment, the DC voltage applied to the focus ring FR is controlled such that the interface between the plasma and the sheath which are formed above the target object W and the focus ring FR becomes flat. For example, the control unit MC has reference information through which the amount of consumption of the focus ring FR can be associated with a voltage value that is required to make the interface between the plasma and the sheath flat. Accordingly, when the amount of consumption of the focus ring FR is measured, the variable DC power supply 330 is controlled to apply a negative DC voltage to the focus ring FR based on the measured amount of consumption.

While the present disclosure has been shown and described with respect to the embodiments, it will be understood by those skilled in the art that various changes and modifications may be made without departing from the scope of the present disclosure as defined in the following claims.

The invention claimed is:

1. A measuring device which is provided in a region surrounded by a focus ring and configured to measure an amount of consumption of the focus ring, the measuring device comprising:
a disc-shaped base substrate;
a plurality of sensor electrodes provided on the base substrate;
a high frequency oscillator configured to apply a high frequency signal to the plurality of sensor electrodes; and
an operation unit configured to calculate a plurality of measurement values indicating electrostatic capacitances of the plurality of sensor electrodes from a plurality of detection values corresponding to potentials of the plurality of sensor electrodes,
wherein the operation unit calculates a representative value of the measurement values corresponding to the amount of consumption of the focus ring and derives the amount of consumption of the focus ring with reference to a table in which the amount of consumption of the focus ring is associated with the representative value of the measurement values corresponding to the amount of consumption.

2. The measuring device of claim 1, wherein the representative value of the measurement values is an average value of the measurement values, and the operation unit calculates an average value of the measurement values and derives the amount of consumption of the focus ring with reference to the table in which the amount of consumption of the focus ring is associated with the average value of the measurement values corresponding to the amount of consumption.

3. The measuring device of claim 1, further comprising:
a notification device configured to perform predetermined notification based on the amount of consumption of the focus ring which is derived by the operation unit.

4. An operation method, comprising:
providing a processing system which includes:
a processing apparatus having a chamber body, a mounting table provided in a chamber provided by the chamber body, and the focus ring provided on the mounting table; and
a transfer unit configured to transfer a target object onto the mounting table and into a region surrounded by the focus ring based on transfer position data, and
providing a measuring device which includes:
a disc-shaped base substrate;
a plurality of sensor electrodes provided on the base substrate;
a high frequency oscillator configured to apply a high frequency signal to the sensor electrodes; and
an operation unit configured to calculate a plurality of measurement values indicating electrostatic capacitances of the sensor electrodes from a plurality of measurement values corresponding to potentials of the sensor electrodes,
the method further comprising:
transferring the measuring device by the transfer unit to a central position in the region specified by the transfer position data;
calculating a representative value of the measurement values calculated by the measuring device transferred to the central position in the region; and
deriving the amount of consumption of the focus ring with reference to a table in which the amount of consumption of the focus ring is associated with the representative value of the measurement values corresponding to the amount of consumption.

5. The method of claim 4, wherein in said calculating, the representative value of the measurement values is an average value of the measurement values, and in said deriving, the amount of consumption of the focus ring is derived with reference to the table in which the amount of consumption of the focus ring is associated with the average value of the measurement values corresponding to the amount of consumption.

6. The method of claim 4, further comprising: performing predetermined notification based on the derived amount of consumption of the focus ring.

7. The method of claim 4, wherein a sequence of said transferring, said calculating and said deriving is periodically executed.

8. The method of claim 7, further comprising:
storing at least one of the measurement value, the average value, and the amount of consumption as a log in a memory.

9. The method of claim 4, further comprising:
adjusting a height of the focus ring based on the amount of consumption of the focus ring such that an interface between plasma and a sheath which are formed above the target object and the focus ring becomes flat.

10. The method of claim 4, further comprising:
applying a negative DC voltage to the focus ring based on the amount of consumption of the focus ring such that the interface between plasma and a sheath which are formed above the target object and the focus ring becomes flat.

\* \* \* \* \*